United States Patent
Springberg et al.

(10) Patent No.: US 11,188,250 B2
(45) Date of Patent: Nov. 30, 2021

(54) TWO-STAGE HYBRID MEMORY BUFFER FOR MULTIPLE STREAMS

(71) Applicant: Micron Technology, Inc., Boise, ID (US)

(72) Inventors: David G. Springberg, Fort Collins, CO (US); David Sluiter, Superior, CO (US)

(73) Assignee: Micron Technology, Inc., Boise, ID (US)

(*) Notice: Subject to any disclaimer, the term of this patent is extended or adjusted under 35 U.S.C. 154(b) by 119 days.

(21) Appl. No.: 16/171,073

(22) Filed: Oct. 25, 2018

(65) Prior Publication Data

US 2020/0133563 A1  Apr. 30, 2020

(51) Int. Cl.
*G06F 12/00* (2006.01)
*G06F 3/06* (2006.01)
*G06F 11/10* (2006.01)
*G11C 29/52* (2006.01)
(Continued)

(52) U.S. Cl.
CPC .......... *G06F 3/0656* (2013.01); *G06F 3/0619* (2013.01); *G06F 3/0685* (2013.01); *G06F 11/1068* (2013.01); *G06F 12/0253* (2013.01); *G11C 29/52* (2013.01); *H03M 13/1102* (2013.01); *G06F 2212/1044* (2013.01); *G06F 2212/7205* (2013.01)

(58) Field of Classification Search
CPC .... G06F 3/0656; G06F 3/0619; G06F 3/0685; G06F 12/0253; G06F 11/1068; G06F 2212/1044; G06F 2212/7205; G11C 29/52; H03M 13/1102
See application file for complete search history.

(56) References Cited

U.S. PATENT DOCUMENTS 5,313,585 A * 5/1994 Jeffries ............... G11B 19/02
                                                711/112
9,158,670 B1 * 10/2015 Kang ............... G06F 12/0246
9,170,876 B1 * 10/2015 Bates ............... G06F 11/1048
(Continued)

FOREIGN PATENT DOCUMENTS

KR      20150095781 A     8/2015

OTHER PUBLICATIONS

International Search Report and Written Opinion dated Feb. 7, 2020, on application No. PCT/US2019/057699.

*Primary Examiner* — Gurtej Bansal
(74) *Attorney, Agent, or Firm* — Lowenstein Sandler LLP

(57) ABSTRACT

Described herein are embodiments related to a two-stage hybrid memory buffer for multiple streams in memory sub-systems. A processing device determines that first write data of a first stream stored in a host buffer component satisfies a threshold to program a first programming unit. The processing device transfers the first write data to the staging buffer component from the host buffer component, and writes the first write data from the staging buffer component as the first programming unit to a first die of multiple non-volatile memory (NVM) dies. The processing device determines that second write data of a second stream satisfies a threshold to program a second programming unit, transfers the second write data to the staging buffer component from the host buffer component, and writes the second write data from the staging buffer component as the second programming unit to a second die of the multiple NVM dies.

20 Claims, 8 Drawing Sheets

(51) Int. Cl.
*H03M 13/11* (2006.01)
*G06F 12/02* (2006.01)

(56) References Cited

U.S. PATENT DOCUMENTS

| | | |
|---|---|---|
| 2009/0049234 A1* | 2/2009 | Oh .................. G06F 3/0647 |
| | | 711/103 |
| 2010/0017650 A1 | 1/2010 | Chin et al. |
| 2013/0080688 A1 | 3/2013 | Park et al. |
| 2014/0068144 A1* | 3/2014 | Fai .................. G06F 12/0246 |
| | | 711/103 |
| 2014/0310574 A1 | 10/2014 | Yu et al. |
| 2015/0317246 A1 | 11/2015 | Xia et al. |
| 2016/0306552 A1 | 10/2016 | Liu et al. |
| 2017/0286151 A1* | 10/2017 | Landers .............. G06F 13/1684 |
| 2017/0329522 A1* | 11/2017 | Yang .................. G06F 12/0253 |

* cited by examiner

TWO-STAGE HYBRID MEMORY BUFFER FOR MULTIPLE STREAMS

TECHNICAL FIELD

Embodiments of the disclosure relate generally to memory sub-systems, and more specifically, relate to a two-stage hybrid memory buffer for multiple streams in the memory sub-systems.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
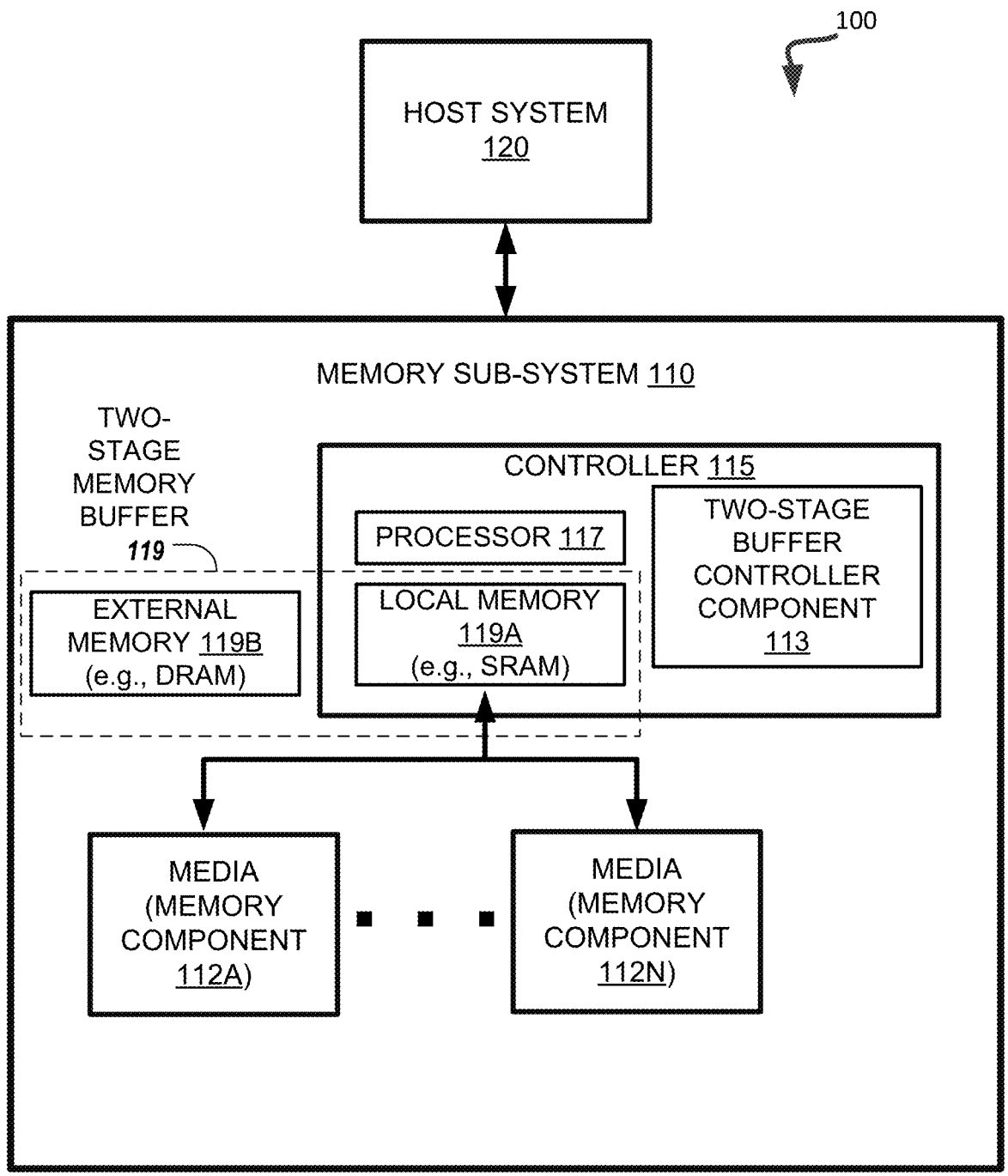
FIG. 1 illustrates an example computing environment that includes a memory sub-system in accordance with some embodiments of the present disclosure.

Aspects of the present disclosure are directed to a two-stage hybrid memory buffer for multiple streams in memory sub-systems. A memory sub-system is also hereinafter referred to as a "memory device" or "memory system." An example of a memory sub-system is a storage system, such as a solid-state drive (SSD). The memory sub-system can be a hybrid memory/storage sub-system. In general, a host system can utilize a memory sub-system that includes one or more memory components. The memory devices can include non-volatile memory devices, such as, for example, negative-and (NAND). The host system can provide data to be stored at the memory sub-system and can request data to be retrieved from the memory sub-system.

A conventional memory sub-system communicates with a host system using a single stream of write data. This conventional memory sub-system uses a buffer for data that goes through a NAND controller to the NAND Flash memory. The buffer is conventionally either an external dynamic random access memory (DRAM) or internal on-chip static RAM (SRAM or internal SRAM). The NAND controller would take write data from the single stream received from the host and aggregate the write data in the external DRAM or aggregate the write data in the internal SRAM until there was enough data to send to the NAND flash for programming. There is enough data when the stored data satisfies (meets or exceeds) a programming unit (PU) threshold, where the PU threshold corresponds to a programming unit size of the one or more NVM devices. The internal SRAM has to support the full bandwidth of the backend and the host. The SRAM supplies the highest bandwidth possible for performance at high cost and the DRAM is significantly lower cost but also lower performance. The problem with the conventional memory sub-system arises when multiple streams are used. In some cases, memory sub-systems are being requested to support 32 streams and can increase to even 1024 streams. The memory sub-system, however, needs to support all these different streams to be open and running at the same time, whether the host system is performing sequential writes (e.g., sequential access) or randomly accessing the different streams with random writes. The conventional memory sub-systems with a single buffer (external DRAM or internal SRAM) cannot support a high number of streams at high performance (e.g., sequential writes or random writes). The size of the internal SRAM in these conventional memory sub-systems would have to be large enough to store the data for all of the streams. Although SRAM has a higher bandwidth than DRAM, the cost to add a larger internal SRAM to an integrated circuit for the single buffer becomes prohibitive from both a cost and die area perspective, as well as from a power perspective. Using DRAM would be cheaper and provide a large memory capacity, performance would be limited to the bandwidth of DRAM. Although a wider DRAM interface can improve DRAM bandwidth, the increase to the DRAM interface would increase the cost and power of the integrated circuit, as well as make it harder to fit into the small form factors like M.2 or EDSFF 1U Short.

Aspects of the present disclosure address the above and other deficiencies by providing a two-stage hybrid memory buffer for supporting multiple streams. The two-stage memory buffer can include a host buffer component (e.g., external DRAM) and a staging buffer component (e.g., internal SRAM). The host buffer component can be a main buffer for all of the data, but the staging buffer component, which can be on-chip SRAM, can stage the data buffer for a stream before it is written to the NVM memory components of the memory sub-system. The data from the host programming streams can be kept segregated into individual programming units (PU) in the host buffer component (main buffer) until there is enough data to program a NVM device (e.g., NVM die, Flash device, or the like). There is enough data or there is sufficient data when an amount of the data satisfies a threshold. At that time, the data in the PU can flow to the staging buffer component (e.g., internal SRAM), where it will be processed with error protection and other features in preparation for writing to NVM memory. The data in the PU would have a much shorter lifetime in the staging buffer component as compared to the host buffer component. An NVM controller would then send the data from the staging buffer component to the NVM device (e.g., flash device). The two-stage memory buffer supports streams and allows the memory sub-system to scale the number of streams, such as 32 streams, 64 streams, 128 streams, 512 streams, 1024 streams, etc.

For example, a host system can communicate with a memory sub-system over a high-speed serial computer bus standard, such as the Peripheral Component Interconnect Express (PCIe) standard or NVM Express (NVMe) using the electrical interface of PCIe. NVMe is an open logical device interface specification for accessing non-volatile storage media attached via an electrical bus. NVMe has low latency and internal parallelism for solid-state storage devices. Multiple streams are part of the NVMe standard and the number of streams to be supported by a memory sub-system is anticipated to scale, for example, from 32 streams up to 1024 streams. The two-stage memory buffer (hybrid of DRAM and internal SRAM) supports multiple streams (e.g., multiple NVMe streams) and the scalability of the number of streams. The staging buffer component can support an increasing number of NVMe streams as streams begin to scale, while keeping costs relatively low and meeting performance and form factor requirements. The staging buffer component stages the data for the backend and all of the high bandwidth that is needed to keep the backend running at full efficiency.

Streams provide a way for the host system to identify different access to the memory sub-system, whether it is for read or write access. The streams are separated from each other with the idea that each stream can be for a certain host task or application. When the host system uses the memory sub-system to store data, the host system combines all of its data. The storage media can be more efficient if the host system can provide a multitude of data for various applications or tasks. Although the data can appear random, the host system can identify the data into these different streams and the memory sub-system can put the respective data for the different streams together into different locations in the NVM backend. Write amplification is an undesirable phenomenon associated with flash memory and SSDs where the actual amount of information physically written to the storage media is a multiple of the logical amount intended to be written. Streams can reduce write amplification. The memory sub-system can easily remove data for a particular stream when the data is stored as streams. For example, the host system can decide to delete a stream and the memory sub-system can trim that data out.

Aspects of the present disclosure address the above and other deficiencies by buffering RAIN data in the two-stage memory buffer. RAIN parity data for each of these multiple streams can add up in size and the two-stage memory buffer can store the RAIN data for these multiple streams in the host buffer component and temporarily in the staging buffer component. Intelligence is added to the controller to manage the staging host buffer component and the staging buffer component of the two-stage memory buffer. The controller, using firmware for example, can control use of the staging area and manage data flow, including managing die collisions in the NVM dies (flash devices).

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as a group of memory cells, wordlines, wordline groups, or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a two-stage memory buffer 119, or a combination thereof. The two-stage memory buffer 119 can include local memory 119A and external memory 119B. In one embodiment, the local memory 119A has one or more SRAM devices or SRAM components and the external memory 119B has one or more DRAM devices or DRAM components. In other embodiments, the local memory 119A can have other types of memory devices, including DRAM devices. It should be noted that on-chip memory devices cost more than external memory devices. The controller 115 can be a SSD controller that manages the staging host buffer component and the staging buffer component of the two-stage memory buffer 119. The SSD controller 115, using firmware for example, can have the intelligence of how to use the staging area and how to manage data flow, including managing die collisions in the NVM dies (flash devices). The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119A. The local memory 119 for storing instructions can be the same or different memory than the local memory used for the two-state memory buffer 119. In the illustrated example, the local memory 119A of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119A can include memory registers storing memory pointers, fetched data, etc. The local memory 119A can also include read-only memory (ROM) for storing micro-code. While the example memory sub-system 110 in FIG. 1 has been illustrated as including the controller 115, in another embodiment of the present disclosure, a memory sub-system 110 cannot include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a two-stage memory buffer 119 (local memory 119A and external memory 119B) and a two-stage buffer controller component 113 that can be used to control transfer of data between the host system 120, the two-stage member buffer 119, and the memory components 112A-112N. In some cases, the external memory 119B can be implemented as one of the memory components 112A-112N and another one or more of the memory components 112A-112N can be NVM components. In some embodiments, the controller 115 includes at least a portion of the two-stage buffer controller component 113. For example, the controller 115 can include a processor 117 (processing device) configured to execute instructions stored in local memory 119A for performing the operations described herein. In some embodiments, the two-stage buffer controller component 113 is part of the host system 110, an application, or an operating system.

The two-stage buffer controller component 113 can determine that first write data of a first stream is stored in external memory 119B (also referred to herein as a host buffer component) satisfies a threshold to program a first programming unit. A size of the first programming unit corresponds to a programming unit size of a NVM die (e.g., memory component 112A). The two-stage buffer controller component 113 transfers the first write data to the local memory 119A (also referred to herein as a staging buffer component). The two-stage buffer controller component 113 writes the first write data from the local memory 119A (staging buffer component) as the first programming unit to a memory component 112A (e.g., a first NVM die). The two-stage buffer controller component 113 determines that second write data of a second stream stored in the external memory 119B (host buffer component) satisfies a threshold to program a second programming unit. The two-stage buffer controller component 113 transfers the second write data to the local memory 119A (staging buffer component) from the external memory 119B (host buffer component). The two-stage buffer controller component 113 writes the second write data from the local memory 119A (staging buffer component) as the second programming unit to a second memory component (e.g., a second NVM die in the memory component 112A or another NVM die in another memory component 112B-N).

Figure 2:
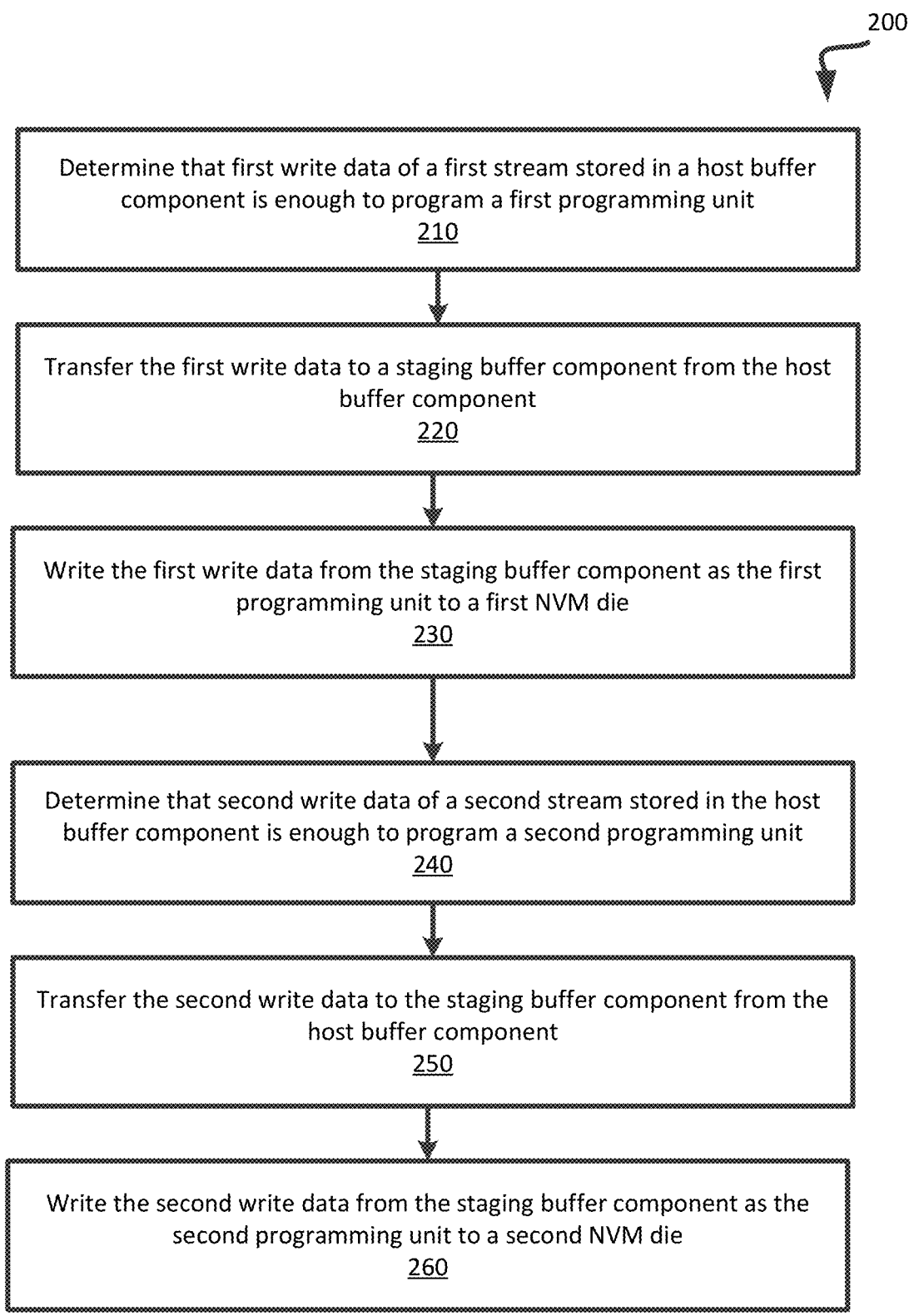
FIG. 2 is a flow diagram of an example method to buffer write data from multiple streams from a host system in a two-stage memory buffer, in accordance with some embodiments of the present disclosure.

FIG. 2 is a flow diagram of an example method 200 to buffer write data from multiple streams from a host system in a two-stage memory buffer, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the memory two-stage buffer controller component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 210, the processing logic determines that first write data of a first stream stored in a host buffer component satisfies a threshold to program a first programming unit of a NVM die. It should be noted that the host can write to the various streams in any order, such that reaching a programming unit size can be in any order. At block 220, the processing logic transfers the first write data to a staging buffer component from the host buffer component. At block 230, the processing logic writes the first write data from the staging buffer component as the first programming unit to a first NVM die. At block 240, the processing logic determines that second write data of a second stream stored in the host buffer component satisfies a threshold to program a second programming unit. At block 250, the processing logic transfers the second write data to the staging buffer component from the host buffer component. At block 260, the processing logic writes the second write data from the staging buffer component as the second programming unit to a second NVM die.

In a further embodiment, the processing logic generates first Redundancy Array of Independent NAND (RAIN) data corresponding to the first write data. The processing logic temporarily stores the first RAIN data in the staging buffer component. The processing logic transfers the first RAIN data from the staging buffer component to the host buffer component in connection with the first write data being written as the first programming unit to the first die. The first RAIN data can be transferred concurrently or sequentially with the first write data being written to the first NVM die. The processing logic generates second RAIN data corresponding to the second write data. The processing logic temporarily stores the second RAIN data in the staging buffer component. The processing logic transfer the second RAIN data from the staging buffer component to the host buffer component in connection with the second write data being written as the second programming unit to the second die. RAIN data can remain in the staging buffer component if there is room; otherwise, the RAIN data can be put back into the host buffer component if not being used to make room for another stream's RAIN data. Similarly, the second RAIN data can be transferred concurrently or sequentially with the second write data being written to the second NVM die.

In a further embodiment, the processing logic stores first garbage collection (GC) data corresponding to any stream in the host buffer component. Not all streams need GC, so the first GC data may correspond to the first stream if the first stream needs GC. Alternatively, the first GC data may correspond to a different stream than the first stream. As described herein, the order of data movement from the staging buffer component and the host buffer component depends on host accesses by the host. The processing logic determines that the first GC data in the host buffer component satisfies a threshold to program a third programming unit. The processing logic transfers the first GC data to the staging buffer component from the host buffer component. The processing logic writes the first GC data from the staging buffer component as the third programming unit to a third NVM die.

In a further embodiment, the processing logic encodes the first write data when transferred between the host buffer component and the staging buffer component. In another embodiment, the processing logic stores GC read data in the staging buffer component. The GC read data can be received from a NVM controller associated with the one or more NVM dies. The processing logic transfers the GC read data from the staging buffer component to the host buffer component and decodes the GC read data when the GC read data is transferred from the staging buffer component to the host buffer component.

In some embodiments, the write data received from the host system is sequential write data. In other embodiments, the write data received from the host system is random write data.

Figure 3:
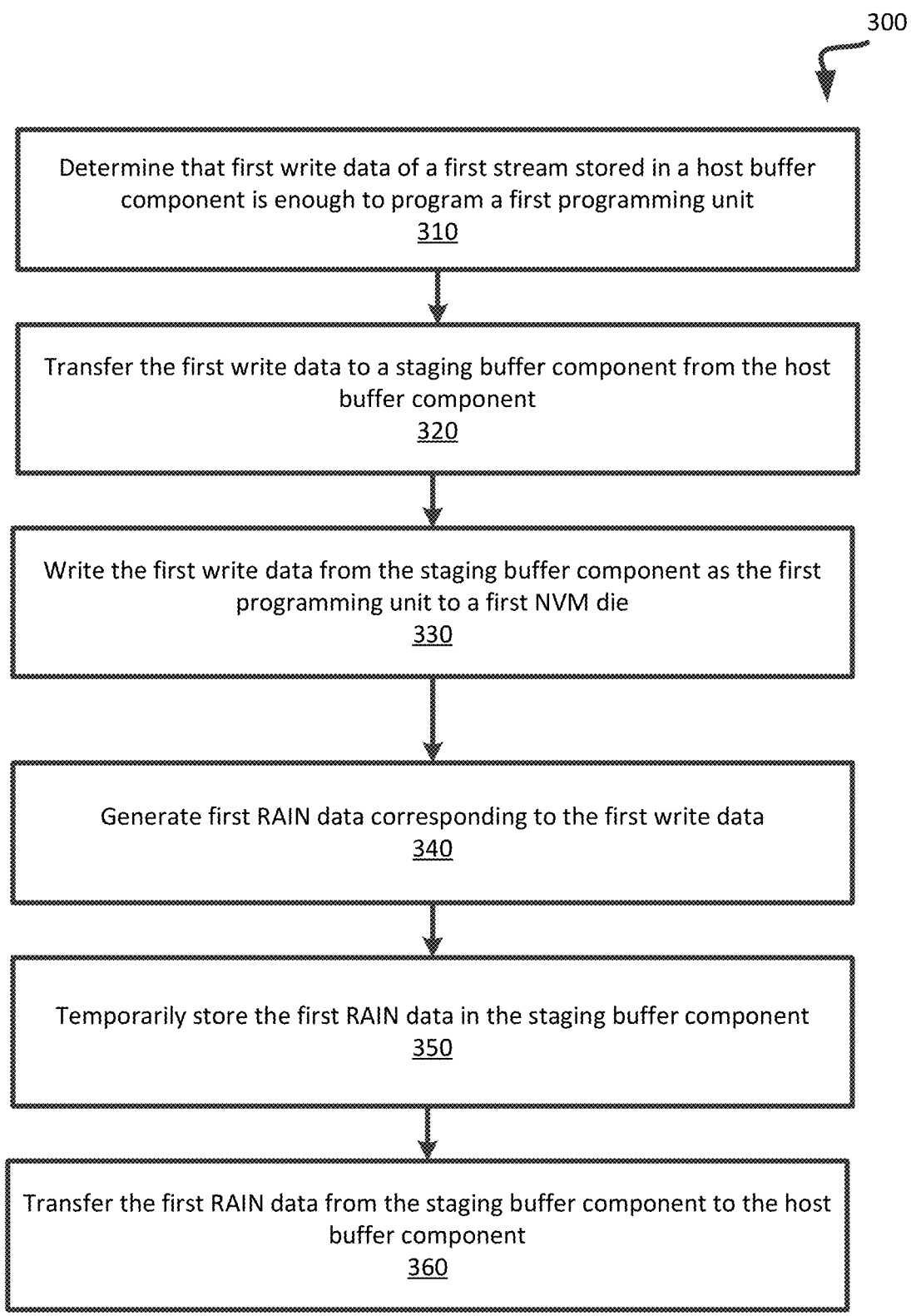
FIG. 3 is a flow diagram of an example method to buffer write data and Redundancy Array of Independent NAND (RAIN) data in a two-stage memory buffer, in accordance with some embodiments of the present disclosure.

FIG. 3 is a flow diagram of an example method 300 to buffer write data and RAIN data in a two-stage memory buffer, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the memory two-stage buffer controller component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 310, the processing logic determines that first write data of a first stream stored in a host buffer component satisfies a threshold to program a first programming unit of a NVM die. A size of the first programming unit corresponds to a size of the NVM die. At block 320, the processing logic transfers the first write data to a staging buffer component from the host buffer component. At block 330, the processing logic writes the first write data from the staging buffer component as the first programming unit to a first NVM die. At block 340, the processing logic generates first RAIN data corresponding to the first write data. At block 350, the processing logic temporarily stores the first RAIN data in the staging buffer component. It should be noted that the first RAIN data is transferred to the staging buffer component before or at the same time as the first write data. At block 360, the processing logic transfers the first RAIN data from the staging buffer component to the host buffer component.

In a further embodiment, the processing logic determines that second write data of a second stream stored in the host buffer component satisfies a threshold to program a second programming unit. The processing logic transfers the write data to the staging buffer component, generates second RAIN data corresponding to the second write data, and writes the second write data from the staging buffer component as the second programming unit to a second NVM die. The processing logic also temporarily stores the second RAIN data in the staging buffer component and subsequently transfers the second RAIN data from the staging buffer component to the host buffer component.

Figure 4:
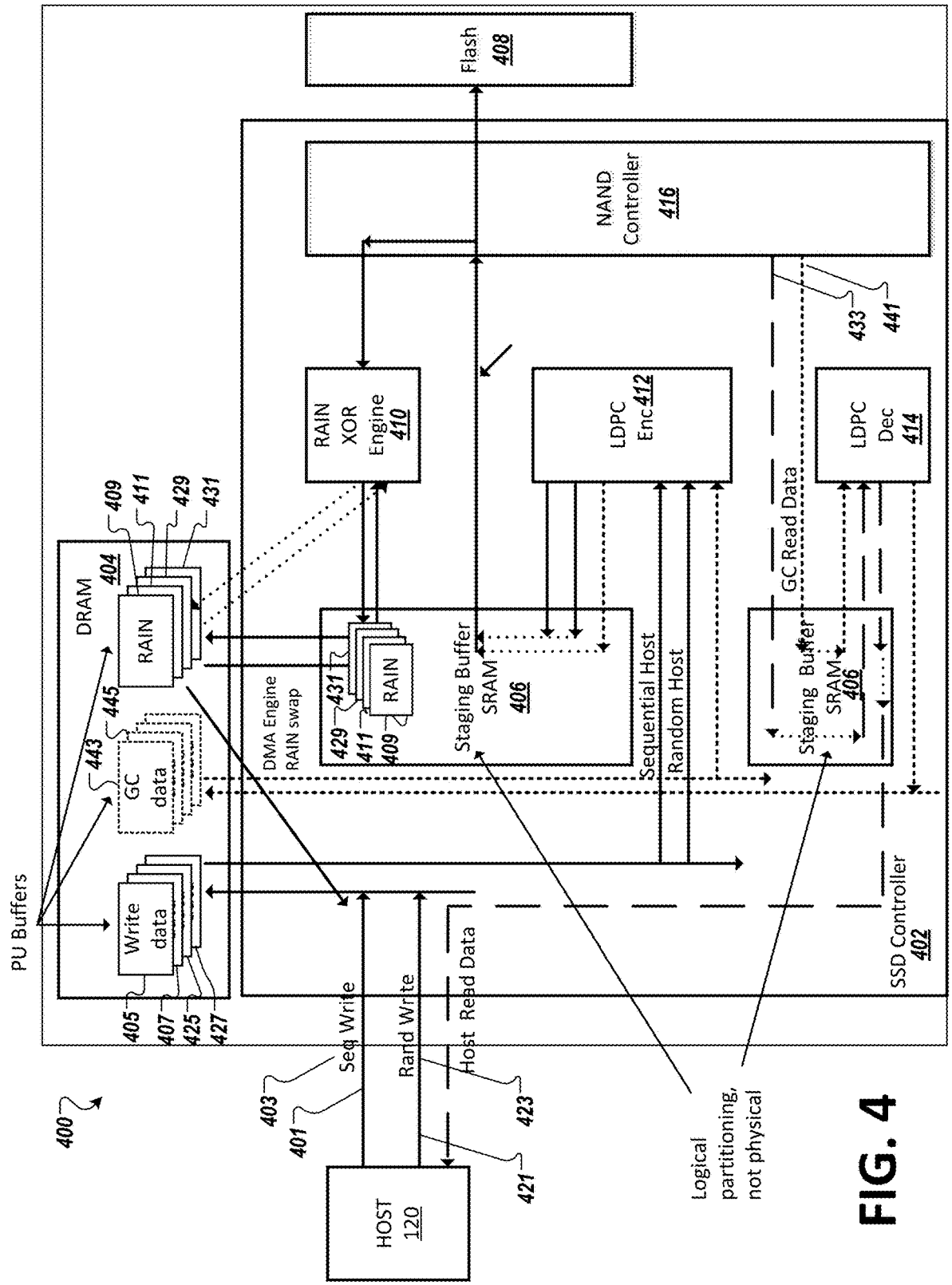
FIG. 4 is a flow diagram of write data, garbage collection data, and RAIN data from multiple streams using a two-stage memory buffer, in accordance with some embodiments of the present disclosure.

FIG. 4 is a flow diagram of data flows for write data, garbage collection data, and RAIN data from multiple streams using a two-stage memory buffer, in accordance with some embodiments of the present disclosure. In the following description of data flows, the host system 120 communicates over an electrical interface with a SSD 400, which includes an SSD controller 402 with a staging buffer SRAM 406, an external DRAM component 404 (also referred to herein as the main buffer component), and flash devices 408. The SSD controller 402 can be the controller 115 described above with respect to FIG. 1 and can include firmware to control interactions of these components for the data flows described below. The SSD controller 402 includes a RAIN exclusive-OR (XOR) engine 410, a low density parity-check (LDPC) encoder 412, a LDPC decoder 414, and a NAND controller 416. IN other embodiments, the various components of the SSD controller 402 can be integrated as separate integrated circuits, such as a separate integrated circuit for the NAND controller 416. The staging buffer SRAM can include multiple logical partitions, as illustrated in FIG. 4. In other embodiments, the SSD 400 can be other types of memory sub-systems and can have different types of memories for the main buffer component, staging buffer component. Also, the LDPC encoder and decoder can be other types of data protection encoder and data protection decoders. Also, the NAND controller 416 and the flash devices 408 can be other types of NVM controllers and NVM storage media.

In a first data flow 401, the host system 120 performs sequential write operations 403 to store write data at the SSD 400. The write data can correspond to one or more streams. For example, the SSD 400 receives first write data 405 of a first stream, second write data 407 of a second stream, and the SSD controller 402 stores the first write data 405 and the second write data 407 separately in the DRAM component 404. The DRAM component 404 can be organized to store the first write data 405 in a programming unit (PU) buffer, where the size of the PU buffer corresponds to a size of dies of the flash devices 408. Data from more than two streams can be received and stored in separate PU buffers in the DRAM component 404. When the SSD controller 402 determines that the first write data 405 of the first stream stored in a first PU buffer of the DRAM component 404 satisfies a threshold to program a first programming unit (PU) (i.e., fills the PU buffer for the first write data), the SSD controller 402 transfer the first write data 405 to the staging buffer SRAM 406. It should be noted that the first stream here is the first of the PU buffers that becomes full, which could be any of the PU buffers depending on the host. Before storing the first write data 405 in the staging buffer SRAM 406, the LDPC encoder 412 encodes the first write data 405. That is, the first write data 405 flows to the LDPC encoder 412 and from the LDPC encoder 412 to the staging buffer SRAM 406. Since the first write data 405 is already one PU in size, the SSD controller 402 can start to program one of the flash devices 408 with the PU corresponding to the first write data 405 stored in the staging buffer SRAM 406. The SSD controller 402 can send the first write data 405 to the NAND controller 416 or the NAND controller 416 can retrieve the first write data 405 from the staging buffer SRAM 406 to write the first write data 405 to a first device of the multiple flash devices 408.

As part of the first data flow 401, the SSD controller 402 can determine that the second write data 407 of the second stream stored in a second PU buffer in the DRAM component 404 satisfies a threshold to program a second PU and transfers the second write data 407 to the staging buffer SRAM 406 via the LDPC encoder 412. The NAND controller 416 can write the second write data 407 from the staging buffer SRAM 406 as the second PU to a second flash device of the multiple flash devices 408. The staging buffer SRAM 406 can be used as a pipeline to stage programming units for programming by the NAND controller 416. For example, once the first write data 405 is being written to the flash devices 408, the second write data 407 can be transferred to the staging buffer SRAM 406 in a staggered fashion. Data from more than two streams of sequential write data can be received and stored in staging buffer SRAM 406.

In some cases, parity information can be generated for the sequential write data being written to the flash devices 408. As illustrated in FIG. 4, the RAIN XOR engine 410 can receive the first write data 407 from the NAND controller 416 and can XOR first RAIN data 409 corresponding to the first write data 405 with existing RAIN data. The RAIN data is normally stored in DRAM and is moved into the staging buffer SRAM 406 with the associated write data. The first RAIN data 409 can be temporarily stored in the staging buffer SRAM 406 before being transferred to the DRAM component 404. This can be performed in connection with the first write data 405 being written as the first programming unit to the first flash device. The RAIN XOR engine 410 can receive the second write data 407 from the NAND controller 416 and generate second RAIN data 411 corresponding to the second write data 407. The second RAIN data 411 can be temporarily stored in the staging buffer SRAM 406 before being transferred to the DRAM component 404. This can be performed in connection with the second write data 407 being written as the second programming unit to the second flash device. Parity data from more than two streams can be generated and stored in the staging buffer SRAM 406 and the DRAM component 404.

As described above with respect to the first data flow 401, the two-stage memory buffer can be used for sequential write data from sequential write data operations 403. In other embodiments, the two-stage memory buffer can be used for random write data received from the host system 120 in connection with random write operations, as illustrated as a second data flow 421.

In the second data flow 421, the host system 120 performs random write operations 423 to store write data at the SSD 400. The random write data can correspond to one or more streams. For example, the SSD 400 receives third write data 425 of a third stream, fourth write data 427 of a fourth stream, and the SSD controller 402 stores the third write data 425 and the fourth write data 427 separately in the DRAM component 404. As described above, the DRAM component 404 can be organized to store the data in PU buffers, where the size of the PU buffer corresponds to a size of dies of the flash devices 408. Data from more than two streams can be received and stored in separate PU buffers in the DRAM component 404. When the SSD controller 402 determines that the third write data 425 of the third stream stored in a third PU buffer of the DRAM component 404 satisfies a threshold to program a third PU (i.e., fills the PU buffer for the third write data), the SSD controller 402 transfer the third write data 425 to the staging buffer SRAM 406. Before storing the third write data 425 in the staging buffer SRAM 406, the LDPC encoder 412 encodes the third write data 425. That is, the third write data 425 flows to the LDPC encoder 412 and from the LDPC encoder 412 to the staging buffer SRAM 406. Since the third write data 425 is already one PU in size, the SSD controller 402 can start to program one of the flash devices 408 with the PU corresponding to the third write data 425 stored in the staging buffer SRAM 406. The SSD controller 402 can send the third write data 425 to the NAND controller 416 or the NAND controller 416 can retrieve the third write data 425 from the staging buffer SRAM 406 to write the third write data 425 to a third device of the multiple flash devices 408.

As part of the second data flow 421, the SSD controller 402 can determine that the fourth write data 427 of the second stream stored in a fourth PU buffer in the DRAM component 404 satisfies a threshold to program a fourth PU and transfers the fourth write data 427 to the staging buffer SRAM 406 via the LDPC encoder 412. The NAND controller 416 can write the fourth write data 427 from the staging buffer SRAM 406 as the fourth PU to a fourth flash device of the multiple flash devices 408. The staging buffer SRAM 406 can be used as a pipeline to stage programming units for programming by the NAND controller 416. For example, once the third write data 425 is being written to the flash devices 408, the fourth write data 427 can be transferred to the staging buffer SRAM 406 in a staggered fashion. Data from more than two streams of random write data can be received and stored in staging buffer SRAM 406.

In some cases, parity information can be generated for the random write data being written to the flash devices 408. As illustrated in FIG. 4, the RAIN XOR engine 410 can receive the third write data 427 from the NAND controller 416 and generate third RAIN data 429 corresponding to the third write data 425. The third RAIN data 429 can be temporarily stored in the staging buffer SRAM 406 before being transferred to the DRAM component 404. This can be performed in connection with the third write data 425 being written as the third programming unit to the first flash device. The RAIN XOR engine 410 can receive the fourth write data 427 from the NAND controller 416 (or other NVM controller) and generate fourth RAIN data 431 corresponding to the fourth write data 427. The fourth RAIN data 431 can be temporarily stored in the staging buffer SRAM 406 before being transferred to the DRAM component 404. This can be performed in connection with the fourth write data 427 being written as the fourth programming unit to the fourth flash device. Parity data from more than two streams can be generated and stored in the staging buffer SRAM 406 and the DRAM component 404.

As described above with respect to the first data flow 401 and the second data flow 421, the two-stage memory buffer can be used for sequential write data from sequential write data operations 403 and for random write data from random write data operations 423. In other embodiments, the two-stage memory buffer can be used for read data received from the multiple flash devices 408 before being sent to the host system 120, as illustrated as a third data flow 433.

In the third data flow 433, the NAND controller 416, in response to a read operation, transfers read data from one of the flash devices 408 to the staging buffer SRAM 406 to be temporarily stored. From the staging buffer SRAM 406, the read data is decoded by the LDPC decoder 414 and sent to the host system 120. In other words, the read data passes from the NAND controller 415 to the staging buffer SRAM 406, from the staging buffer SRAM 406 to the LDPC decoder 414, and from the LDPC decoder 414 to the host system 120.

As described above with respect to the third data flow 433, the two-stage memory buffer can be used for read data from read data operations. In other embodiments, the two-stage memory buffer can be used for garbage collection (GC) read data from GC read operations, as illustrated as a fourth data flow 441.

In the fourth data flow 441, the NAND controller 416, in response to a GC read operation in connection with the first stream (first write data 405), transfers first GC data 443 to the staging buffer SRAM 406 to be temporarily stored. From the staging buffer SRAM 406, the first GC data 443 is decoded by the LDPC decoder 414 and sent to the DRAM component 404. The GC data can also correspond to one or more streams. As described above, the DRAM component 404 can be organized to store the GC data in PU buffers, where the size of the PU buffer corresponds to a size of dies of the flash devices 408. GC data from more than two streams can be received and stored in separate PU buffers in the DRAM component 404, such as illustrated as first GC data 443 and second GC data 445. When the SSD controller 402 determines that the first GC data 425 of the first stream stored in a fifth PU buffer of the DRAM component 404 satisfies a threshold to program a fifth PU (i.e., fills the PU buffer for the first GC data), the SSD controller 402 transfer the first GC data 443 to the staging buffer SRAM 406. Before storing the first GC data 443 in the staging buffer SRAM 406, the LDPC encoder 412 encodes the first GC data 443. That is, the first GC data 443 flows to the LDPC encoder 412 and from the LDPC encoder 412 to the staging buffer SRAM 406. Since the first GC data 443 is already one PU in size, the SSD controller 402 can start to program one of the flash devices 408 with the PU corresponding to the first GC data 443 stored in the staging buffer SRAM 406. The SSD controller 402 can send the first GC data 443 to the NAND controller 416 or the NAND controller 416 can retrieve the first GC data 443 from the staging buffer SRAM 406 to write the first GC data 443 to a third device of the multiple flash devices 408.

It should be noted that for the garbage collection flows, the GC reads can run at the same bandwidth as write operations and only the valid transfer units (TUs) are read from NAND controller 416. The TU is the base granularity that data is managed (e.g., 4096B). Once the GC data is aggregated into new PU buffers, the backend write bandwidth is shared with the write operations (e.g., 403, 423). Write amplification can determine a ratio of GC data to host write data. In some implementations, the GC data from the NAND controller 415 is transferred to the staging buffer SRAM 406 over multiple channels. Multiple channels can share the same buffer depending on the percentage of valid data. The LDPC decoder 414 reads, processes, and then writes the decoded data to the DRAM component 404. The GC data is aggregated into new PU buffers. The GC write data flow is the same as for write data from the host system 120. In particular, the GC write data can be sent to the staging buffer SRAM 406 under the same rules as the write data. As illustrated in FIG. 4, the staging buffer SRAM 406 holds the GC read data until it is transferred to DRAM while also holding GC write data. In one embodiment, the staging buffer SRAM 406 has two logical partitions; a first logical partition in which the write data and/or GC write data are temporarily stored before being written to the flash devices 408 and a second logical partition in which the host read data and/or GC read data are temporarily stored before being transferred to the host system 120 or the DRAM component 404, respectively. Therefore, the staging buffer SRAM 406 should allocate capacity for GC reads in addition to write data capacity.

In order to scale from one stream to many streams, such as up to 1024 streams, the DRAM component 404 is the only option for expansion and the staging buffer SRAM 406 operates as a pipeline in which all host write data and all GC read data are accumulated in the DRAM component 404 until there satisfies a threshold to program a die in a stream. In one implementation, a die of the flash devices 408 can have a programming unit (PU) size of 330 KB per NAND die. In one implementation, the write amplification (WA) is 2.1. The RAIN storage is also split between the DRAM component 404 and the staging buffer SRAM 406. Some number of RAIN contexts can be resident in the staging buffer SRAM 406. As stream count goes up, swapping of RAIN contexts between the DRAM component 404 and the staging buffer SRAM 406 can occur. In one implementation, one or more DMA engines can be used to swap RAIN contexts between the DRAM component 404 and the staging buffer SRAM 406.

In one implementation based on the WA previously mentioned, a bandwidth of the sequential write operations 403 is 4600 MB/s, a bandwidth of the random write operations 423 is 1250 MB/s, and a bandwidth of the host read data is 6600 MB/s. Transfers of the sequential write data from the DRAM component 404 to staging buffer SRAM 406 can also have a bandwidth of 4600 MB/s for sequential write data and a bandwidth of 1250 MB/s for random write data. Transfer of the GC write data from the DRAM component 404 to staging buffer SRAM 406 can also have a bandwidth of 2625 MB/s for GC write data. This can be determined by multiplying 1250 by the write amplification of 2.1. The random write data and the GC write data collectively can operate with a bandwidth of 4000 MB/s with a 31/32 code rate. The LDPC encoder can operate with a bandwidth of 4600*0.92 for the sequential write data, 1250*0.92 for the random write data, and 2625*0.92 for the GC write data, where 0.92 is the LDPC code rate. Transfers of the data from the staging buffer SRAM 406 to the NAND controller 416 can have an average bandwidth of 5150 MB/s (e.g., 4600/0.92*32/31). This can account for writing RAIN data to the flash devices 408 at a 31/32 code rate. The one or more DMA engines can swap RAIN data at a bandwidth of 4000 MB/s between the DRAM component 404 and the staging buffer SRAM 406. The staging buffer SRAM 406 and the RAIN XOR engine 410 can transfer RAIN data with a bandwidth of 9600 MB/s since the RAIN XOR engine 410 can have a peak rate of 8*1200 MB/s. For read operations, the staging buffer SRAM 406 and the NAND controller 416 can have an average bandwidth of 7174 MB/s (6600/0.92) for transfers of host read data and GC read data. The LDPC decoder 414 and staging buffer SRAM 406 can have a bandwidth of 2853 Mb/s for GC read data transferred between the staging buffer SRAM 406 and the DRAM component 404. The bandwidth between the NAND controller 416 and the host system 120 via the staging buffer is 6600 MB/s. The bandwidth between the NAND controller 416 and the DRAM component 404 via the staging buffer is 2625 MB/s. The various bandwidths described above are exemplary based on the programming unit size, DRAM and SRAM technologies being used. In other implementations, the various bandwidths can vary. The PU size can also be 220 KB, 660 KB, 440 KB, 293 KB, or the like. The PU size can be driven by a page size and a number of planes. For example, the PU size of 330 KB can be derived from a page size of 18344 bytes/pages*3 pages*6 planes. The bandwidths can depend on a program time, an ONFI transfer time, a DRAM transfer time, as well as the programming algorithm, such as 1-pass programming or 2-pass programming (8 programming levels to 16 programming levels).

In one embodiment, the design requirements for the two-stage memory buffer architecture include 33 streams), 16 sets, host sequential write of 4.6 GB/s, encoded rate of 5.15 GB/s (calculated as 4600 MB/s sequential host write/ LDPC code rate of 0.92*32/31 (31/32 RAIN code rate), Rand write FOG=1M KIOPs-4.1 GB/s (for WA=1), and Rand Wr SS of 2.1, 64b DDR interface at 3200 MT/x with 15/16 ECC overhead, and ONFI 4.1 interface burst rate of 1200 MT/s The write amplification of 2.1 is estimated as 4600 MB/s in the back-end is de-rated to 4000 MB/s to account for additional FW overhead (4000 MB/s/4096=977 KIOPs back-end). The write amplification effect as seen by the host is system is 3.2 (2*WA)−1). The 977 KIOPs/ 3.2=305 KIOPs (estimates it at 312 KIOPs), so 305 KIOPs*4096=1250 host write bandwidth. The GC bandwidth post LDPC decoder is 1250 MB/s*2.1=2625 MB/s (plus background scan overhead). The primary rationale for this flow is for building programming units in DRAM, as well as holding RAIN context in DRAM, in order to scale write data storage as the number of streams is expected to increase over time. As noted above, the bandwidth values can vary based on different design requirements for the two-stage memory buffer architecture.

In order to minimize on-chip SRAM and provide scalability above the requirements described above, the host data and RAIN data are stored in DRAM. For this scenario, the host write data is accumulated in DRAM until there satisfies a threshold data to program a die for a stream. The SRAM can be used as a staging buffer for the host data, GC data, and RAIN contexts. RAIN contexts need to be written back to DRAM when the XOR is done. Alternatively, the XOR operation could be done with the RAIN contexts in DRAM. But XOR bandwidth can burst up to 9.6 GB/s when all 8 channels are transferring data out, which would require 19.2 GB/s access to DRAM to read and write a RAIN context. If the DRAM cannot keep up, the ONFI bus can be throttled, which does not impact performance until the ONFI average bandwidth drops below 800 MT/s.

Figure 5:
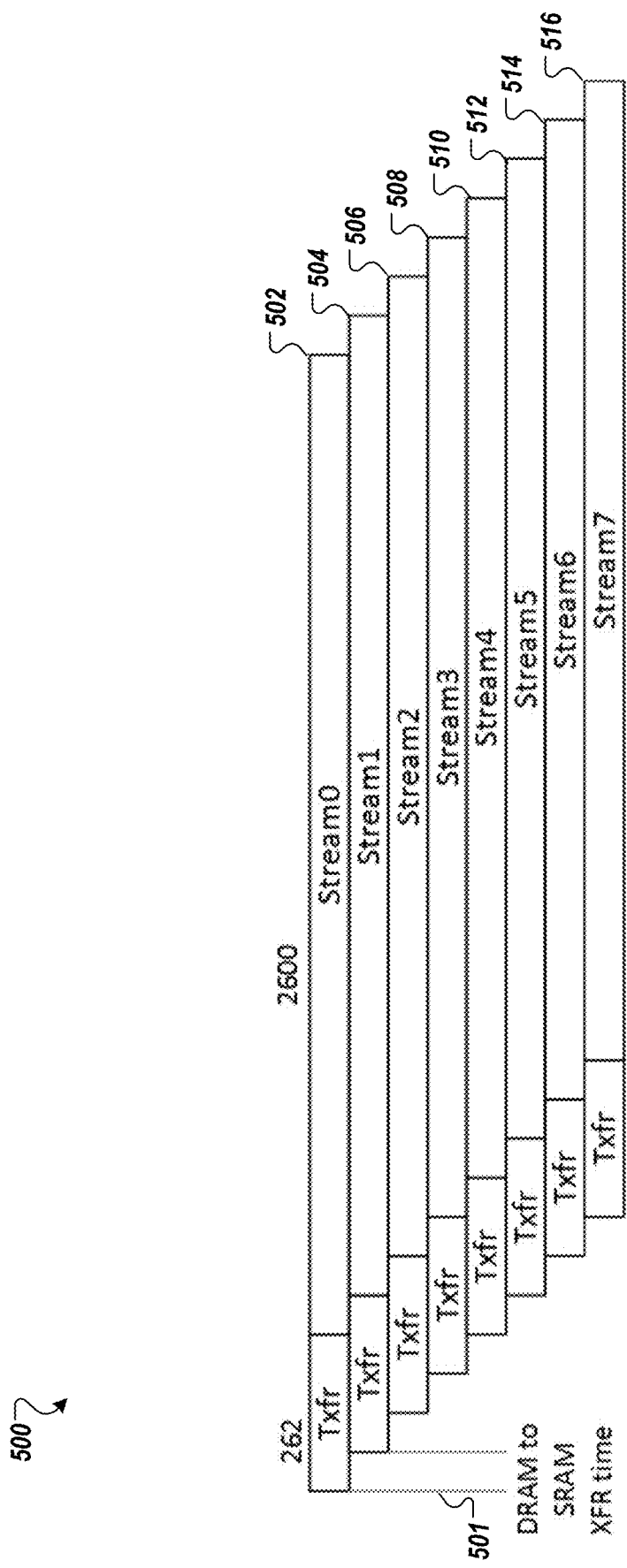
FIG. 5 is a diagram illustrating eight streams striped across eight channels to idle dies, in accordance with some embodiments of the present disclosure.

FIG. 5 is a diagram 500 illustrating eight streams 502-516 striped across eight channels to idle dies, in accordance with some embodiments of the present disclosure. Continuing with the example above of a PU size of 330 KB, a program bandwidth is 115 MB/s (330,192B/2862 μs). The minimum average throughput per channel is 644 MB/s (5.15 GB/8). At least 45 die must be turned on to meet the system write bandwidth of 5.15 GB/s, or about 6 die per channel. As shown in FIG. 5, there are 8 channels, each channel to accommodate one of the eight streams. The delay 501 between each stream is determined by the time it takes data to be moved from DRAM to SRAM (plus any firmware overhead).

In one implementation to describe the staging buffer concept, by storing Host write data in DRAM, the on-chip SRAM becomes a staging buffer component that can support very high bandwidth interface to the ONFI backend. The ONFI maximum bandwidth (9.6 GB/s) is much higher than the Host bandwidth (5.15 GB/s—encoded), so the staging buffer component normally empties faster than it fills.

Figure 6:
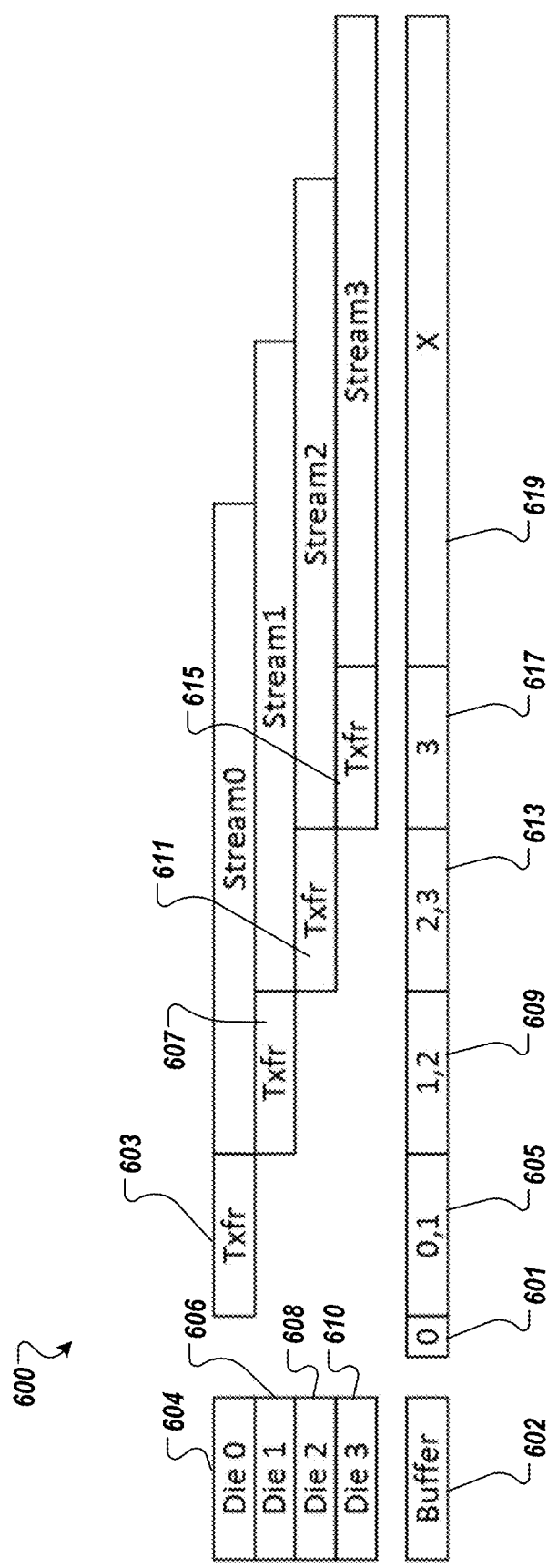
FIG. 6 is a diagram illustrating a staging buffer used for programming four streams on a single channel, in accordance with some embodiments of the present disclosure.

FIG. 6 is a diagram 600 illustrating a staging buffer used for programming four streams on a single channel, in accordance with some embodiments of the present disclosure. For a general data flow, firmware can evaluate the current channel/die activity, and the available PUs. Firmware then selects the next PU to program. Firmware initiates data encoding and programs the NAND controller with the NAND operation. The encoder starts filling a staging buffer component 602 with Stream0, as illustrated at 601 in FIG. 6. After filing the staging buffer component 602 with the Stream0 host data (and optionally the associated RAIN data) at 601, the NAND data transfer 603 starts with the XOR operation on a first channel (Ch0 NAND) to a first die 604 (Die0). When the data transfer 603 is complete, the Stream0 host buffer can be released. If there are no other Stream0 Host writes pending and the RAIN context is in the staging buffer component 602, then the Stream0 RAIN data should be transferred (via DMA engines) back to the DRAM. After filling the staging buffer component 602 with the Stream1 host data (and optionally the associated RAIN data) at 603, the NAND data transfer 607 starts with the XOR operation on the same channel (Ch0 NAND) to a second die 606 (Die1). When the data transfer 607 is complete, the same flow defined above for Die0 is done for Die1. After filing the staging buffer component 602 with the Stream2 host data (and optionally the associated RAIN data) at 609, the NAND data transfer 609 starts with the XOR operation to a third die 608 (Die2). When the data transfer 609 is complete, the same flow defined above for Die0 is done for Die2. After filing the staging buffer component 602 with the Stream3 host data (and optionally the associated RAIN data) at 6611, the NAND data transfer 612 starts with the XOR operation to a fourth die 610 (Die3). When the data transfer 612 is complete, the same flow defined above for Die0 is done for Die3. This can be done to all remaining dies in parallel as shown in FIG. 6. As shown, data can always be moving through the staging buffer component 602, but the tenure of the data in the staging buffer component 602 is short.

Since the data is organized in DRAM as programming units, the firmware can have PU selection rules and can prevent or reduce channel collisions or die collisions. When a host system writes to various Streams that target the same channel/die, performance can degrade regardless of the data flow. To minimize collisions, firmware can stagger and randomly sequence Stream stripes across channels and die. Performance can be significantly impacted if the staging buffer component backs up with writes to the same channel/die, thereby preventing other operations from using the staging buffer component since stream data will be held up in the staging buffer component for the duration of the ONFI transfer and program of the operation ahead of it. If multiple PUs target the same channel/die, then the staging buffer component can fill up. To avoid filling up the staging buffer component when the Host overloads writes to one channel or die, firmware can follow these rules: 1) limit the amount of program operations per channel to two; 2) if the PU targets a busy die, use a cache program operation or hold in DRAM until die becomes free; or the like. FIG. 6 shows a sequence in which a channel collision of four back-to-back programs targeting different dies and the next stream data can be transferred to the staging buffer component 602 at 619, while the current NAND data transfer is in progress. In one embodiment, about six PUs fill the staging buffer component 602 during the time to transfer 1 PU to NAND, so at most 3 channels could look like as shown in FIG. 6. Alternatively, the staging buffer component 602 can be sized to fit more or less PUs than six.

Figure 7:
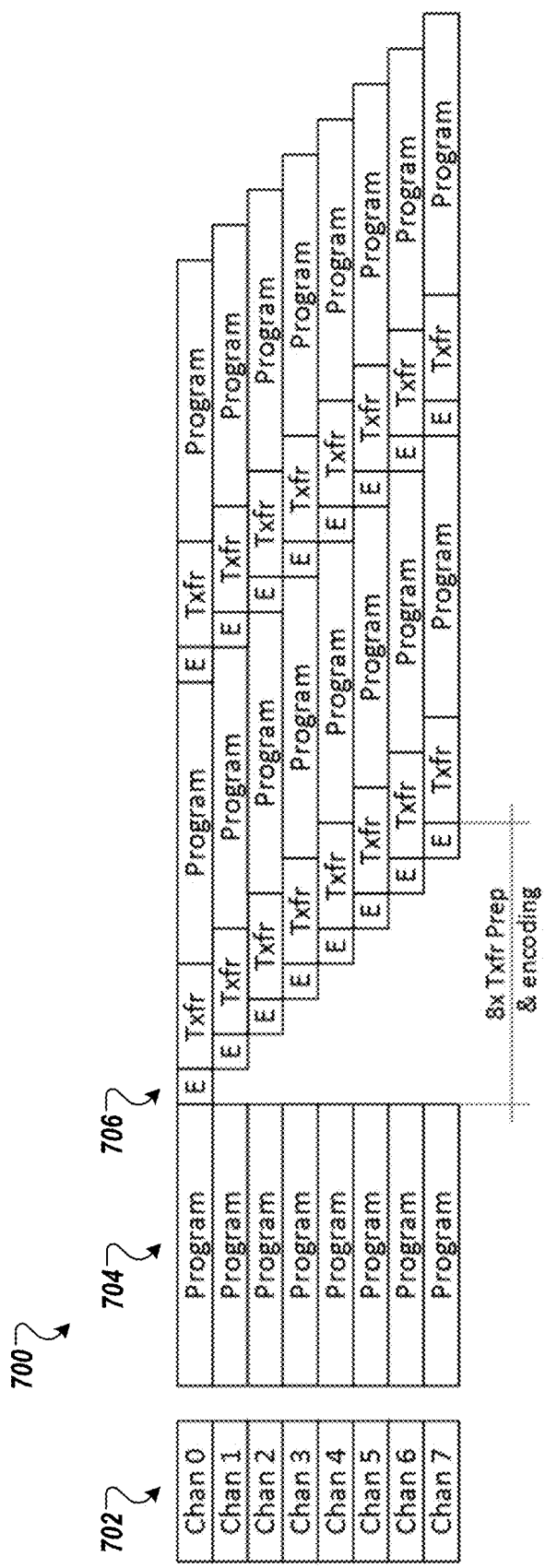
FIG. 7 is a diagram illustrating a sequence with program operations across all eight channels completing at the same time, in accordance with some embodiments of the present disclosure.

FIG. 7 is a diagram illustrating a sequence with program operations across all eight channels completing at the same time, which is unlikely, in accordance with some embodiments of the present disclosure. A delay 706, labeled E, is the time to transfer the data to the staging buffer component and configure the NAND controller for the program operation. In this worst case scenario, all existing channel programs 704 complete at the same time and none of the pending program operations 704 are in the staging buffer component.

In one embodiment, cache programming can be done to reduce this issue by doing the encode operation and preparation during a previous program operation. It should be noted that the cache programming increase the write cache size by effectively adding another data buffer. So cached program operations should only be used when targeting a die that is already in use by another programming operation. When this scenario occurs, the channel programs 704 are staggered such that it does not repeat while writes continue (but will eventually become randomly aligned), as illustrated in FIG. 7. Write bandwidth can require six active dies per channel. Transferring data to six die at 300 μs per transfer takes 1.8 ms, leaving about 1 ms of idle channel time for every 6 data transfers. Some of the pending program operations 704 can already be in the staging buffer component.

In one embodiment for sequential write data, the two-stage memory buffer can have 18 programming units with the PU size of 330 KB and the staging buffer SRAM can be 5804 KB. For example, the host data can have eight PUs and would need 2580 KB in SRAM, the RAIN data can have ten PUs and would need 3225 KB in SRAM. For an effective ONFI rate of 1 GB/s, at least six programming units can be buffered at a time (rounded to 8). For the RAIN data, two additional programming units can be used, as compared to the host data, since tenure of the RAIN data in the buffer is longer for the XOR operation.

In another embodiment for random write data, the two-stage memory buffer can have 24 programming units, including seven for host data, nine for RAIN data, and eight for GC data. For this embodiment, the SRAM can be 7739 KB, including 2257 for the host data, 2902 for the RAIN data, and 2580 for the GC data. For an effective ONFI rate of 1 GB/s, at least five programming units can be buffered at a time (rounded to 7). For the RAIN data, two additional programming units can be used, as compared to the host data, since tenure of the RAIN data in the buffer is longer for the XOR operation. For 50% validity in the GC data, read data from 8 channels uses 4 buffers times 2 deep, decoded and sent to DRAM.

Since the random write data uses more PUs, if an 8 MB SRAM and 24 PUs were used, there are six or more PUs for the sequential write data. These extra PUs can be used to permanently store 6 RAIN PUs. This can reduce the RAIN context switching BW by approximately 18%, depending on the Host workload. If there is block level RAIN protection for streams, then 2 MB could be saved, bringing the SRAM down to 6 MB, or the additional 2 MB could be used to hold more RAIN contexts or be used for other purposes as that firmware sees fit.

Figure 8:
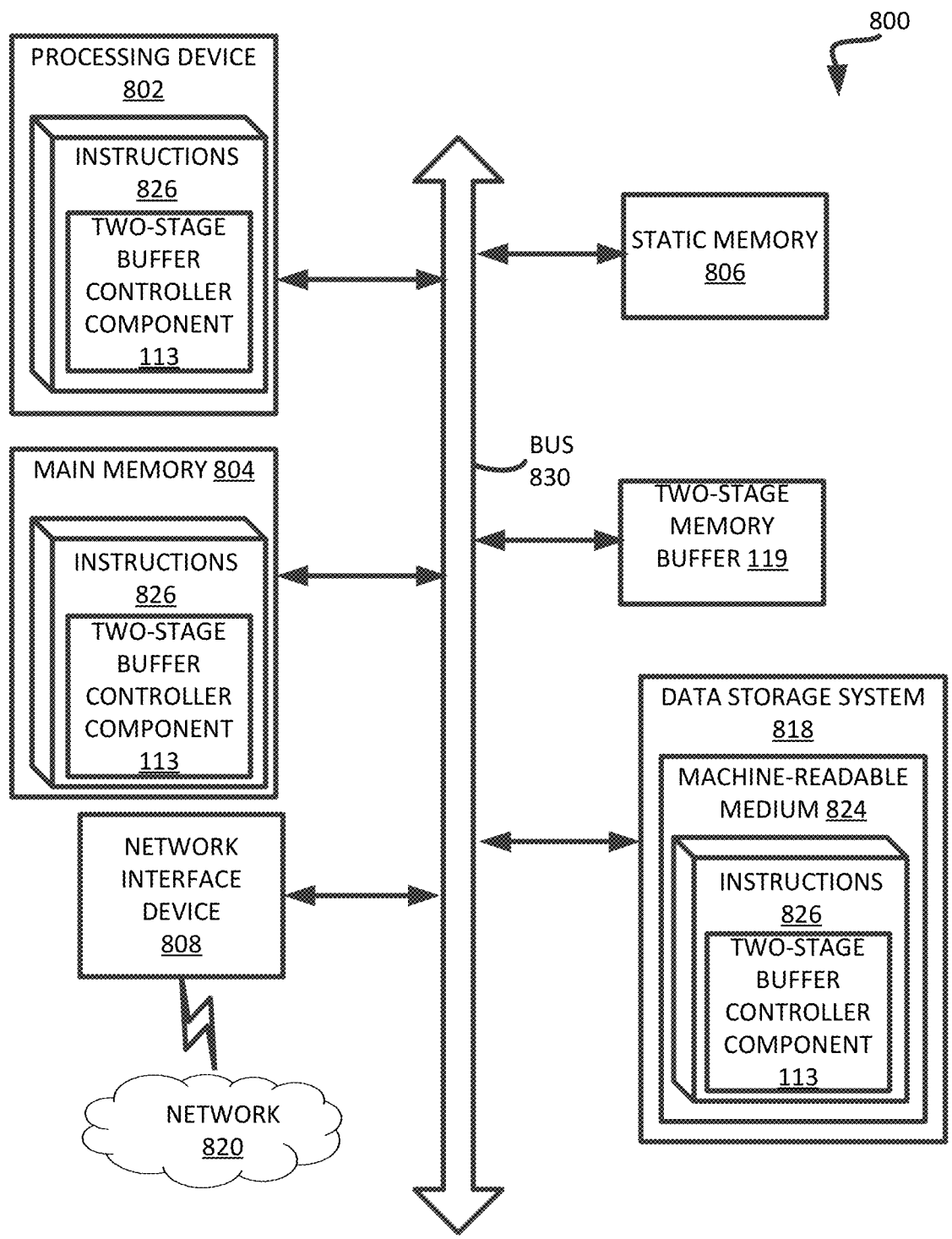
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the two-stage buffer controller component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a non-transitory computer-readable storage medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to the two-stage buffer controller component (e.g., the two-stage buffer controller component 113 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a two-stage memory buffer of a memory sub-system comprising:
a host buffer component of the two-stage memory buffer comprising dynamic random access memory (DRAM), wherein the host buffer component is to store first write data of a first stream and second write data of a second stream, the first write data and the second write data received from a host system, wherein the first write data of the first stream is to be stored at a first programming unit buffer of a plurality of programming unit buffers of the host buffer, and wherein the second write data of the second stream is to be stored at a second programming unit buffer of the plurality of programming unit buffers of the host buffer, the first programming unit buffer dedicated to storing write data of the first stream and the second programming unit buffer dedicated to storing write data of the second stream;
a staging buffer component of the two-stage memory buffer operatively coupled to the host buffer component, wherein the staging buffer component comprises static random access memory (SRAM);
a non-volatile memory (NVM) controller, operatively coupled to the staging buffer component, the NVM controller to manage the host buffer component and the staging buffer component of the two-stage memory buffer;
a plurality of NVM dies coupled to the NVM controller and the staging buffer component, the plurality of NVM dies comprising NVM; and
a processing device, operatively coupled with the host buffer component, the staging buffer component, and the NVM controller, to:
determine that the first write data of the first stream stored in the host buffer component satisfies a threshold to program a first programming unit, wherein a size of the first programming unit corresponds to a size of one of the plurality of NVM dies;
transfer the first write data to the staging buffer component from the first programming unit buffer of the host buffer component;
write the first write data from the staging buffer component as the first programming unit to a first die of the plurality of NVM dies;
determine that the second write data of the second stream stored in the host buffer component satisfies a threshold to program a second programming unit;
transfer the second write data to the staging buffer component from the second programming unit buffer of the host buffer component; and
write the second write data from the staging buffer component as the second programming unit to a second die of the plurality of NVM dies.

2. The system of claim 1, wherein the first write data is sequential write data received from a host system.

3. The system of claim 1, wherein the first write data is random write data received from a host system.

4. The system of claim 1, wherein the host buffer component is further to store first garbage collection (GC) data corresponding to the first stream in the host buffer component, wherein the processing device is further to:
determine that the first GC data in the host buffer component satisfies a threshold to program a third programming unit;
transfer the first GC data to the staging buffer component from the host buffer component; and
write the first GC data from the staging buffer component as the third programming unit to a third die of the plurality of NVM dies.

5. The system of claim 1, further comprising:
a Redundancy Array of Independent NAND (RAIN) exclusive-OR (XOR) engine coupled to the staging buffer component and the NVM controller, the RAIN XOR engine to:
receive the first write data from the NVM controller;
generate first RAIN data corresponding to the first write data; and
store the first RAIN data in the staging buffer component, wherein the processing device is further to transfer the first RAIN data corresponding to the first write data from the staging buffer component to the host buffer component in connection with the first write data being written as the first programming unit to the first die.

6. The system of claim 5, wherein the RAIN XOR engine is further to:
receive the second write data from the NVM controller;
generate second RAIN data corresponding to the second write data; and
store the second RAIN data in the staging buffer component, wherein the processing device is further to transfer the second RAIN data corresponding to the second write data from the staging buffer component to the host buffer component in connection with the second write data being written as the second programming unit to the second die.

7. The system of claim 1, further comprising:
a data protection encoder coupled between the staging buffer component and the host buffer component, the data protection encoder to encode the first write data when transferred between the host buffer component and the staging buffer component.

8. The system of claim 7, further comprising:
a data protection decoder coupled between the staging buffer component and the host buffer component, the data protection encoder to decode GC read data received from one or more of the plurality of NVM dies when the GC read data is transferred from the staging buffer component to the host buffer component.

9. The system of claim 8, wherein the data protection encoder is a low density parity-check (LDPC) encoder and the data protection decoder is a LDPC decoder.

10. The system of claim 8, wherein the staging buffer component comprises:
a first logical partition in which the first write data is temporarily stored before being written to the first die and the second write data is temporarily stored before being written to the second die; and
a second logical partition in which the GC read data is temporarily stored before being transferred to the host buffer component.

11. A system comprising:
a host interface to receive first write data of a first stream and second write data of a second stream from a host system;
a dynamic random access memory (DRAM) interface to couple to one or more external DRAM devices, wherein the first write data of the first stream is to be stored at a first programming unit buffer of a plurality of programming unit buffers of the one or more external DRAM devices, and wherein the second write data of the second stream is to be stored at a second programming unit buffer of the plurality of programming unit buffers of the one or more external DRAM devices, the first programming unit buffer dedicated to storing write data of the first stream and the second programming unit buffer dedicated to storing write data of the second stream;
an internal static RAM (SRAM) device, wherein the one or more external DRAM devices and the internal SRAM device are included in a memory sub-system;
one or more non-volatile memory (NVM) devices;
a NVM controller to manage the internal SRAM device and the one or more external DRAM devices; and
a processing device, operatively coupled with the host interface, the DRAM interface, the internal SRAM device, the NVM controller, and the one or more NVM devices, to:
transfer the first write data, from the first programming unit buffer of the one or more external DRAM devices, to the internal SRAM device when the first write data satisfies a programming unit (PU) threshold, the PU threshold corresponding to a PU size of the one or more NVM devices;
write the first write data from the internal SRAM device as a first programming unit to the one or more NVM devices;
transfer the second write data, from the second programming unit buffer of the one or more external DRAM devices, to the internal SRAM device when the second write data satisfies the PU threshold; and
write the second write data from the internal SRAM device as a second programming unit to the one or more NVM devices.

12. The system of claim 11, further comprising:
a low density parity-check (LDPC) encoder coupled between the internal SRAM device and the DRAM interface; and
a LDPC decoder coupled between the internal SRAM device and the NVM controller.

13. The system of claim 11, further comprising:
a Redundancy Array of Independent NAND (RAIN) exclusive-OR (XOR) engine coupled between the internal SRAM device and the NVM controller, the RAIN XOR engine to:
generate first RAIN data corresponding to the first write data;
store the first RAIN data in the internal SRAM component before being transferred to the one or more external DRAM devices via the DRAM interface;
generate second RAIN data corresponding to the second write data; and
store the second RAIN data in the internal SRAM component before being transferred to the one or more external DRAM devices via the DRAM interface.

14. The system of claim 11, further comprising:
a low density parity-check (LDPC) encoder coupled between the internal SRAM device and the DRAM interface, wherein the LDPC encoder is to receive the first write data via the host interface, encode the first write data, and store the first write data in a first logical partition of the internal SRAM device; and
a LDPC decoder coupled between the internal SRAM device and the NVM controller, wherein the NVM controller stores garbage collection (GC) data in a second logical partition of the internal SRAM device, wherein the LDPC decoder is to receive the GC data from the internal SRAM device, decode the GC data, and send the GC data to the one or more external DRAM components via the DRAM interface.

15. The system of claim 11, wherein the first write data is first sequential write data received from the host system, wherein the second write data is second sequential write data received from the host system.

16. The system of claim 11, wherein the first write data is sequential write data received from the host system, wherein the second write data is random write data received from the host system.

17. A method comprising:
determining that first write data of a first stream stored in a host buffer component of a two-stage memory buffer of a memory sub-system satisfies a threshold to program a first programming unit, wherein a size of the first programming unit corresponds to a size of one of a plurality of non-volatile memory (NVM) dies, wherein the first write data of the first stream is stored at a first programming unit buffer of a plurality of programming unit buffers of the host buffer component, the first programming unit buffer dedicated to storing write data of the first stream;
transferring the first write data to a staging buffer component of the two-stage memory buffer of the memory sub-system from the first programming unit buffer of the host buffer component, wherein the host buffer component and the staging buffer component of the two-stage memory buffer are managed by a NVM controller associated with the plurality of NVM dies;
writing the first write data from the staging buffer component as the first programming unit to a first die of the plurality of NVM dies;
determining that second write data of a second stream stored in the host buffer component satisfies a threshold to program a second programming unit, wherein the second write data of the second stream is to be stored at a second programming unit buffer of the plurality of programming unit buffers of the host buffer component, the second programming unit buffer dedicated to storing write data of the second stream;
transferring the second write data to the staging buffer component from the second programming unit buffer of the host buffer component; and
writing the second write data from the staging buffer component as the second programming unit to a second die of the plurality of NVM dies.

18. The method of claim 17, further comprising:
generating first Redundancy Array of Independent NAND (RAIN) data corresponding to the first write data;
temporarily storing the first RAIN data in the staging buffer component; and
transferring the first RAIN data from the staging buffer component to the host buffer component in connection with the first write data being written as the first programming unit to the first die;
generating second RAIN data corresponding to the second write data;
temporarily storing the second RAIN data in the staging buffer component; and
transferring the second RAIN data from the staging buffer component to the host buffer component in connection with the second write data being written as the second programming unit to the second die.

19. The method of claim 17, further comprising:
storing first garbage collection (GC) data corresponding to the first stream in the host buffer component;

determining that the first GC data in the host buffer component satisfies a threshold to program a third programming unit;

transferring the first GC data to the staging buffer component from the host buffer component; and writing the first GC data from the staging buffer component as the third programming unit to a third die of the plurality of NVM dies.

20. The method of claim 17, further comprising:

encoding the first write data when transferred between the host buffer component and the staging buffer component;

storing garbage collection (GC) read data in the staging buffer component, the GC read data being received from the NVM controller associated with the plurality of NVM dies;

transferring the GC read data from the staging buffer component to the host buffer component; and decoding the GC read data when the GC read data is transferred from the staging buffer component to the host buffer component.

* * * * *